United States Patent [19]

Buettner

[11] Patent Number: 5,531,444
[45] Date of Patent: Jul. 2, 1996

[54] COATED GOLF CLUB AND APPARATUS AND METHOD FOR THE MANUFACTURE THEREOF

[76] Inventor: Dale Buettner, N163W19351 Cedar Run Dr., Jackson, Wis. 53037

[21] Appl. No.: 240,312

[22] Filed: May 10, 1994

[51] Int. Cl.⁶ .................................................. A63B 53/04
[52] U.S. Cl. ............................................................ 473/349
[58] Field of Search ............................. 273/167 R, 167 J, 273/167 A, 77 R, DIG. 23, 167 H, 170, 169, 175, 171, 173, 167 B, 167 F, 168, 193 R, 194 R

[56] References Cited

U.S. PATENT DOCUMENTS

| | | | |
|---|---|---|---|
| 2,908,502 | 10/1959 | Bradstreet | 273/167 J |
| 4,134,759 | 1/1979 | Yajima | 273/DIG. 32 |
| 4,556,607 | 12/1985 | Sastri | 428/627 |
| 4,951,953 | 8/1990 | Kim | 273/80 B |
| 5,104,457 | 4/1992 | Viljoen | 273/167 R |
| 5,207,427 | 5/1993 | Saeki | 273/167 R |

FOREIGN PATENT DOCUMENTS

| | | | |
|---|---|---|---|
| 0029329 | 3/1980 | Japan | 273/167 R |
| 2168974 | 6/1990 | Japan | 273/167 R |
| 1309582 | 10/1991 | Japan . | |

Primary Examiner—Sebastiano Passaniti
Attorney, Agent, or Firm—Donald Cayen

[57] ABSTRACT

A golf club head is coated with a hard and attractive coating of titanium nitride. The club head hozzle is supported during the coating process by a carbon pin inserted into the hozzle bore. The pin end inserted into the hozzle bore preferably has a frusto-conical surface with a very steep paper. The pin supports the hozzle tubular wall as the club head is heated and coated during the coating cycle and also prevents any coating material from being deposited onto the hozzle bore. As a result, any distortion of the hozzle and bore because of changing temperatures is eliminated.

2 Claims, 4 Drawing Sheets

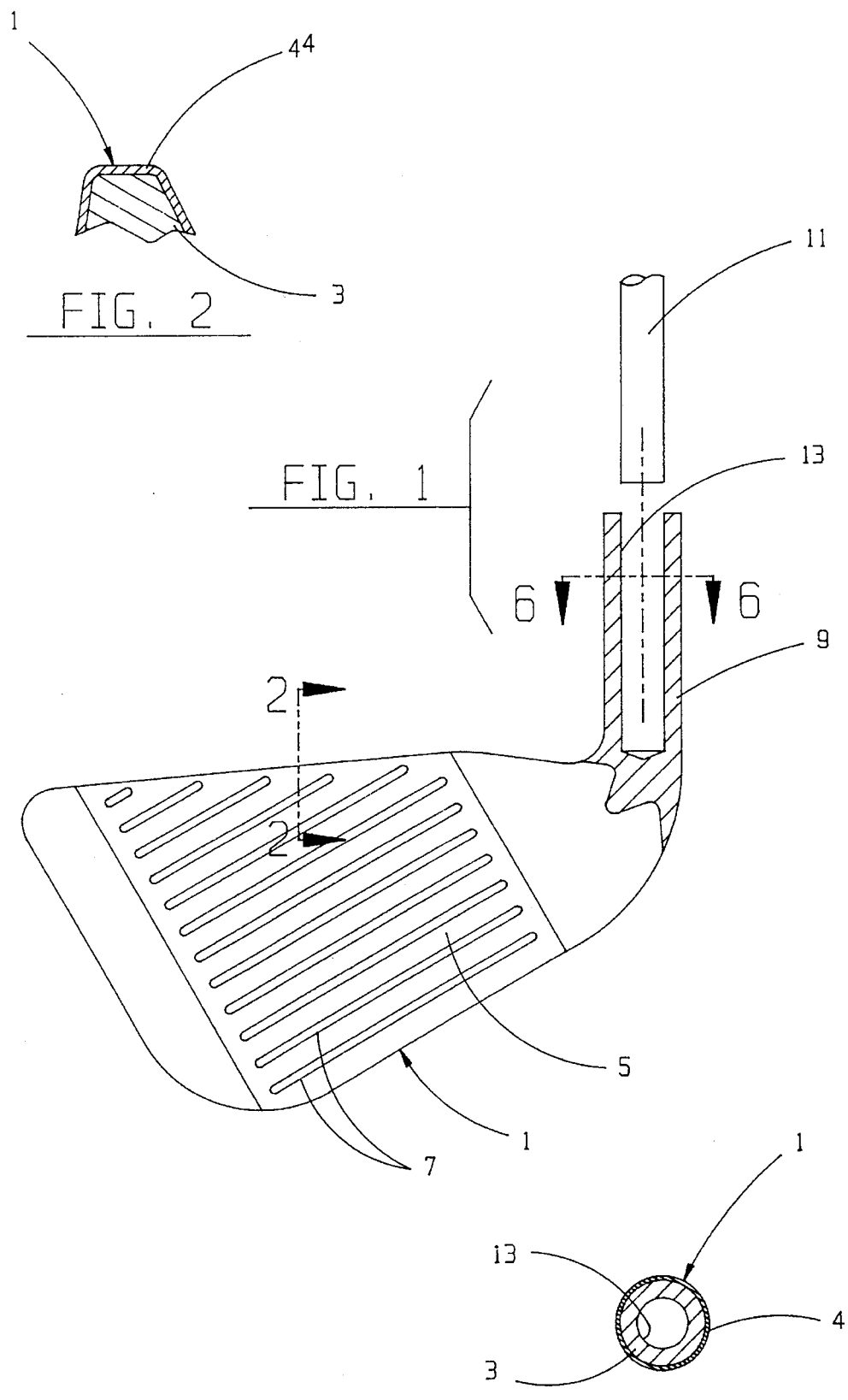

COATED GOLF CLUB AND APPARATUS AND METHOD FOR THE MANUFACTURE THEREOF

BACKGROUND OF THE INVENTION

1. Field of the Invention.

This invention pertains to article coating, and more particularly to methods and apparatus for coating the surfaces of golf club heads.

2. Description of the Prior Art

It is well known to clad ferrous and non-ferrous substrates with thin coatings of dissimilar materials. Coating is often undertaken to change the surface qualities of the substrate, such as to improve hardness, wear resistance, corrosion resistance, and appearance. For example, it is known to treat the surfaces of cutting tools by such processes as black oxidizing, nitriding, electrolytic plating, chemical vapor deposition, and physical vapor deposition.

Exemplary metallic coatings and sub-coatings for various substrates are described in U.S. Pat. No. 4,556,607, the specification of which is incorporated by reference herein. A few applications of the coatings and sub-coatings are also given in the foregoing patent. However, a description of materials, apparatus, and processes required to successfully coat a golf club head is lacking.

Coating golf club heads presents certain difficulties not encountered in most other coating applications. A particular difficulty is that the bore in the club head hozzle tends to distort when subjected to the heat of a coating furnace. As a consequence, it is usually necessary to remachine the hozzle bore before the head can be assembled to the club handle. To efficiently manufacture a golf club head with a coating of the U.S. Pat. No. 4,556,607 patent or any other coating, therefore, it is first necessary to discover a way to prevent hozzle bore distortion during the coating process.

SUMMARY OF THE INVENTION

In accordance with the present invention, a coated golf club head is provided that retains the geometry of the hozzle bore thereof during a coating process, together with apparatus for carrying out the coating process. This is accomplished by employing a portion of the coating apparatus to protect the hozzle bore from the coating material during the coating process.

The golf club head desirably is cast from a Series 300 or Series 400 stainless steel in conventional fashion. The hozzle is drilled and reamed or bored to the correct diameter and depth to suit a particular club shaft. The club head is cleaned in an ultrasonic cleaning machine or by other suitable means in known manner. The dried club head may be wiped with alcohol or a fluorocarbon solvent. Several clean club heads are placed in an appropriate furnace. The deposition of the coating material may be generally conventional, as, for example, by chemical vapor deposition or physical vapor deposition. The preferred coating possesses high hardness, low coefficient of friction, and an attractive gold appearance. For example, the coating material may comprise up to about 80 percent by volume of titanium nitride. To produce the gold appearance, approximately seven to ten percent by weight of niobium may be added to the titanium nitride.

To prevent distortion of the golf club heads during the coating process, a pin is inserted into the hozzle bore of each club head. The pin has a first end with nominal diameter equal to the inner diameter of the club head hozzle bore. However, the pin first end has a frusto-conical shape, with a very steep taper of between approximately one and two degrees included angle. The apex end of each pin frusto-conical surface is inserted into the club head hozzle bore, with the hozzle shoulder being supported on the pin frusto-conical surface. Preferably, the pins are made of pure carbon, as that material does not appreciably expand or contract with changes in temperature within the range encountered in normal coating processes. Alternately, the pins may be made of the same material as the club head substrate, such as stainless steel.

In either case, each pin has a second end that is pressed into a first axial bore of a small cog. The cog has opposed flat faces, in one of which is machined the first axial bore. A second bore in the cog second face is placed over a boss on a fixture, which may be a ring. The ring bosses are spaced circumferentially to enable the cogs to rotate about their respective bosses without the club heads placed on the associated pins striking each other.

The ring is supported and rotated about a vertical axis within the coating furnace in any suitable manner, as is known in the art. At least one rod extends from the inside wall of the furnace. The rod has a free end in a position to strike the cog teeth as the cogs revolve past the rod, thereby indexing the cogs a few degrees relative to the ring bosses. In that manner, the club heads rotate about their respective guide bosses to assure even coating. When the coating process is completed, the club head is coated with a very thin, hard, tough, and low-friction layer of titanium nitride, but the hozzle bore remains uncoated. Further, the hozzle bore is in an undistorted condition ready to accept the golf club shaft.

The method and apparatus of the invention, using tapered pins inserted into golf club hozzle bores, thus enables the club heads to be coated at high temperatures with a protective and attractive metallic material without distorting the hozzle bores. The prior necessity of machining the hozzle bores after coating in order to assemble the club heads to their shafts is eliminated.

Other advantages, benefits, and features of the invention will become apparent to those skilled in the art upon reading the detailed description of the invention.

BRIEF DESCRIPTION OF THE DRAWINGS

FIG. 1 is a partially broken front view of a golf club head coated according to the present invention.

FIG. 2 is a magnified cross sectional view taken along line 2—2 of FIG. 1.

FIG. 6 is a magnified cross sectional view taken along line 6—6 of FIG. 1.

DETAILED DESCRIPTION OF THE INVENTION

Figure 3:
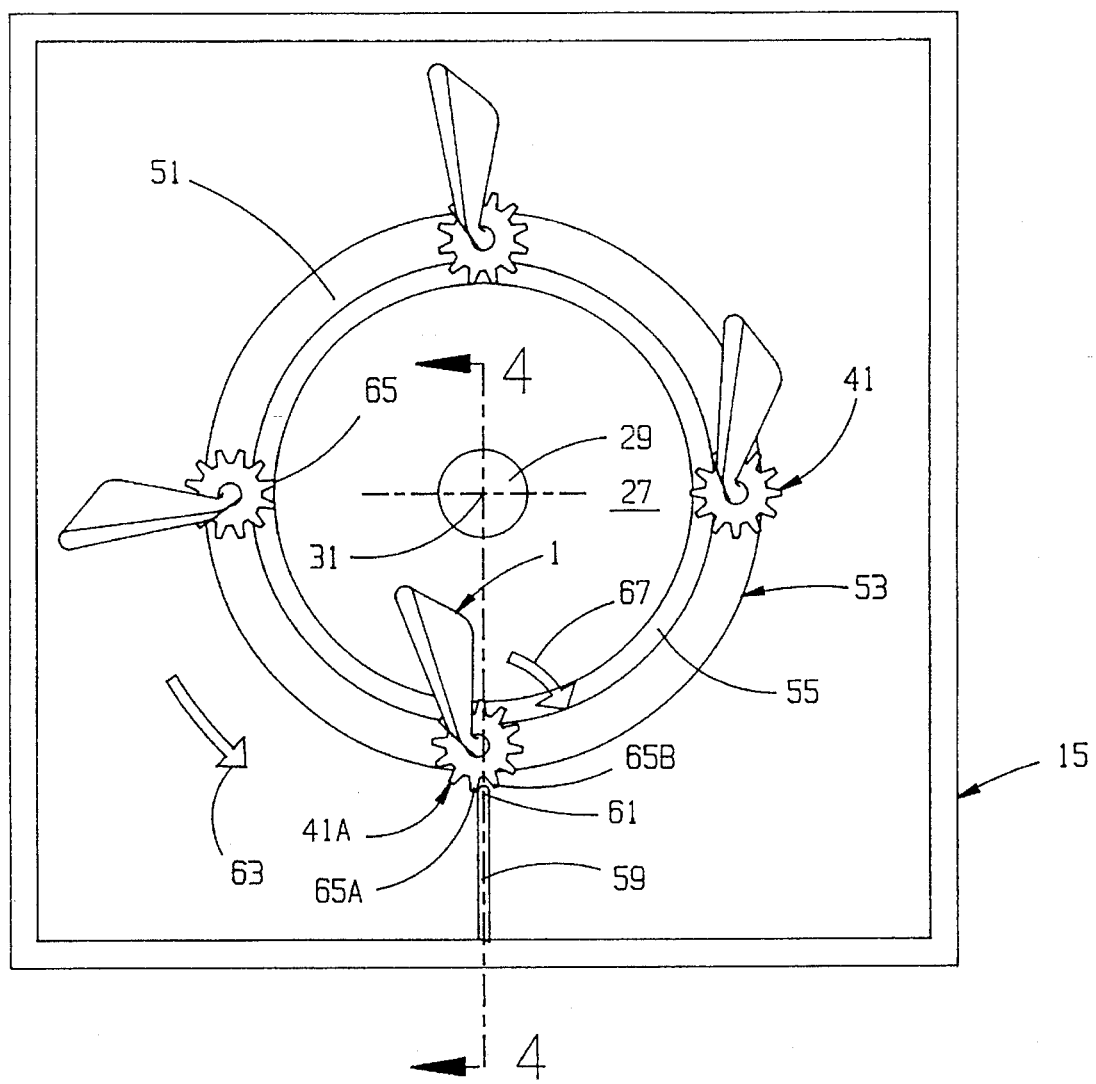
FIG. 3 is a top view of several club heads supported on a fixture suitable for use with a physical vapor deposition furnace.

Although the disclosure hereof is detailed and exact to enable those skilled in the art to practice the invention, the physical embodiments herein disclosed merely exemplify the invention, which may be embodied in other specific structure. The scope of the invention is defined in the claims appended hereto.

Referring to FIGS. 1 and 2, a golf club head 1 is illustrated that includes the present invention. The particular golf club head 1 depicted is merely representative of a wide variety of club head designs that are in common use. Like all club heads, the head 1 has a flat face 5 that is designed to strike a golf ball, not shown. The face 5 may be formed with several generally parallel shallow grooves 7, as are known in the art. The head further comprises a hozzle 9 that is used to join the head to a club shaft 11. For that purpose, the hozzle 9 has a longitudinal bore 13 of a diameter and length to receive and securely retain the shaft 11 to the head.

In accordance with the present invention, the golf club head 1 is made as a substrate 3 that is coated with a layer 4 of metallic material in a manner that does not distort the hozzle bore 13 during the coating process. Suitable materials for the club head substrate 3 include Series 300 or Series 400 stainless steels. The preferred material is a type 316 stainless steel.

The preferred coating 4 is titanium nitride material as described in U.S. Pat. No. 4,556,607. However, it will be understood that other coating materials may also be clad onto the head substrate 3. The titanium nitride coating includes microcrystalline, single phase, solid solution structures containing about 20–70 percent by weight of cobalt or nickel; approximately 8–35 percent by weight of chromium; approximately 3–20 percent by weight of hafnium or tungsten; approximately 0.5–10 percent by weight of carbon, nitrogen, or boron; wherein the coating has dissolved therein about 30–60 percent by volume of a material selected from the group consisting of nitrides, carbides, and borides of titanium, hafnium, and zirconium. Preferably, a minimum of approximately 50 percent by volume of titanium nitride is dissolved in the coating. The coating is very thin, preferably being between approximately 0.0002 inches and 0.0004 inches thick.

The titanium nitride material provides a very hard, tough, and low-friction coating to the club head 1. In addition, the club head acquires a very attractive lustrous gold appearance. The friction free material of the titanium nitride coating inhibits dirt, grass, and mud from sticking to the club face 5 during play. Further, the low friction characteristic allows the club to swing through grass adjacent a golf ball without slowing to thereby impart greater speed to the ball than is possible without the coated face. The extremely hard nature of the titanium nitride coating resists wear and enables the corners of the grooves 7 to remain sharp, which maintains driving power imparted to a golf ball, during extended use.

Prior to being coated with the titanium nitride layer 4, the golf club heads 1 are thoroughly cleaned, as with an ultrasonic cleaner, not illustrated. A suitable cleaning procedure involves setting the club heads in wire baskets and immersing them in a cleaning solution having about 70 parts water and about 30 parts soap. The first cleaning step lasts at least four minutes. During the second cleaning step, the heads are immerse in a cleaner composed of approximately 95 parts water and 5 parts soap for a minimum of four minutes. In the third step, the heads are immersed in clear water for approximately four minutes. In the fourth cleaning step, the heads are immersed for a minimum of four minutes in liquid Freon with an additive to make the Freon boil. Then the heads are immersed for approximately four minutes in liquid Freon without the boiling additive. As the last step in the cleaning process, the heads are allowed to dry and are then wiped with isopropyc alcohol.

Figure 4:
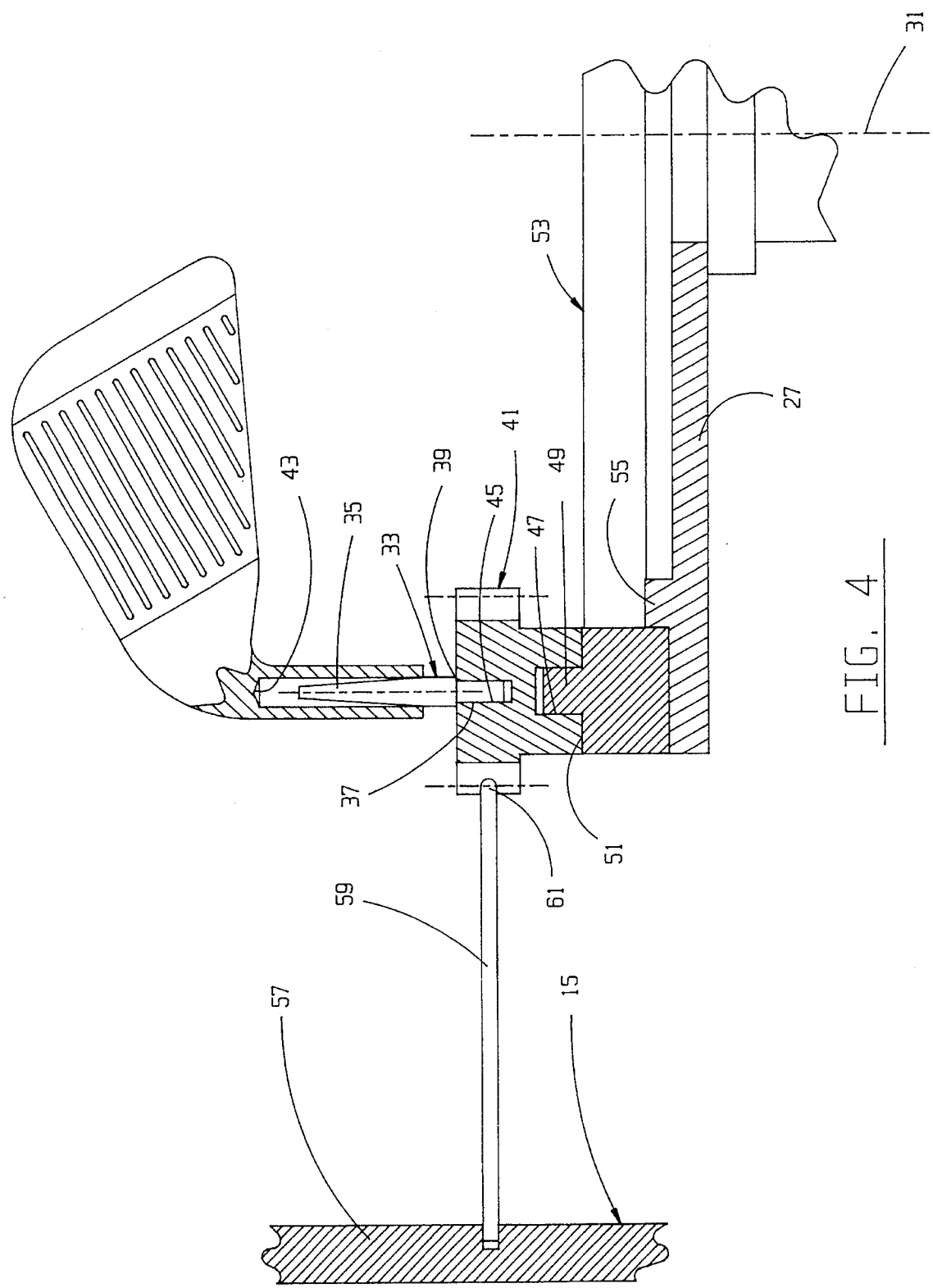
FIG. 4 is an enlarged cross sectional view taken along line 4—4 of FIG. 3 and rotated 90 degrees clockwise.
Figure 5:
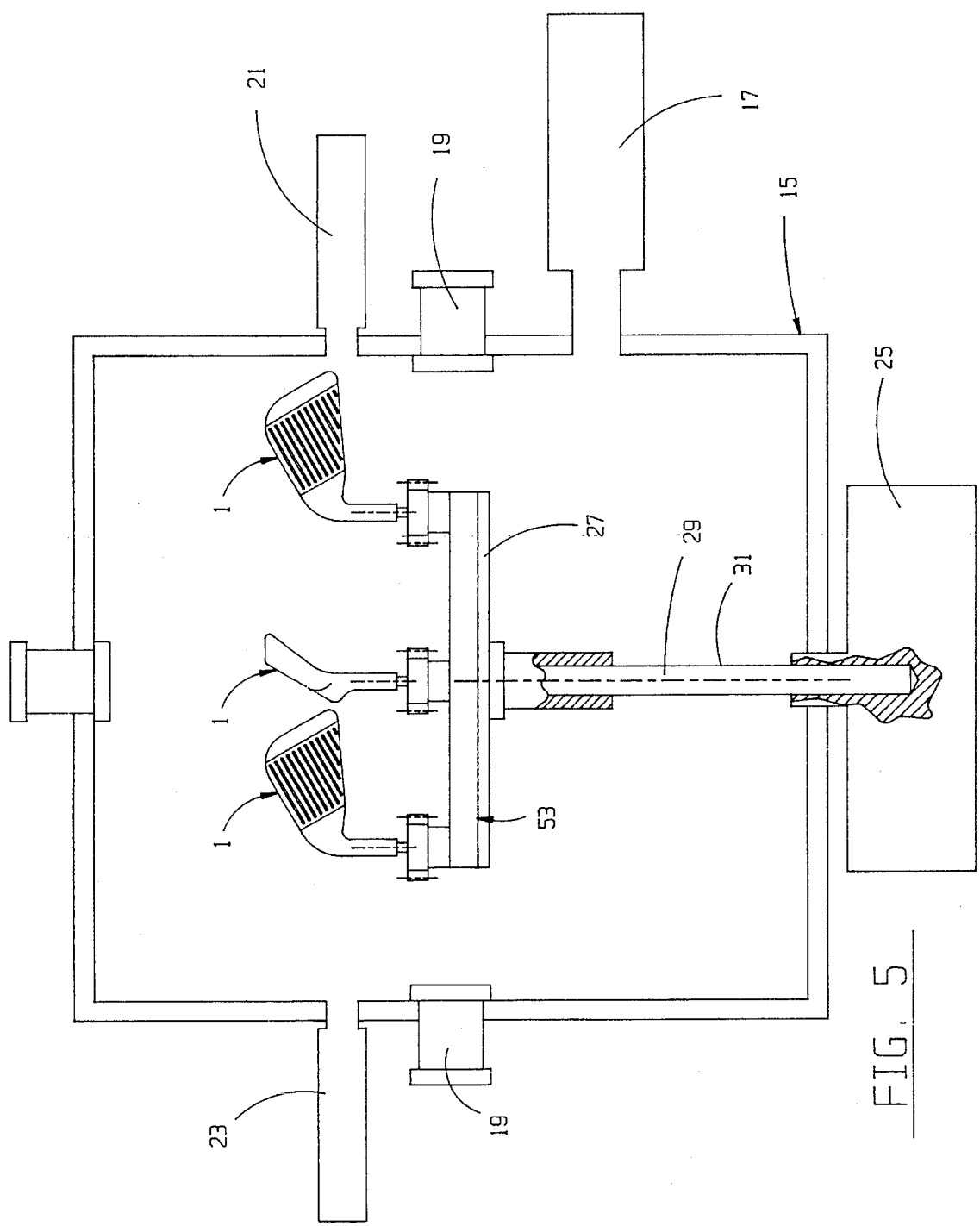
FIG. 5 is a simplified cross sectional view of the golf club heads and fixture within a physical vapor deposition furnace.

Looking also at FIGS. 3–5, golf club heads 1 are preferably coated with the titanium nitride layer 4 in a conventional coating furnace, which is schematically depicted at reference numeral 15, by the physical vapor deposition process. The physical vapor deposition furnace 15 comprises a vacuum pump 17. Reference numerals 19 represent cathodes from which titanium ions are evaporated by highly localized electric arcs. The titanium ions are associated with nitrogen gas provided from a supply 21 to produce a self-sustaining arc that generates a high energy plasma. The plasma is directed toward the club heads 1 to be coated. A neutral gas is supplied to the furnace from a supply 23 thereof.

The furnace 15 further includes a plate 27 for supporting the golf club heads 1. The plate 27 is fixed to a shaft 29 for rotation about a vertical axis 31 by a motor 25. The shaft 29 is driven by the suitable rotary drive, not illustrated, for slowly rotating the plate 19 and the club heads about the axis 31.

During the vapor deposition process, the temperature of the golf club heads 1 to be coated is raised to at least approximately 650 degrees Fahrenheit. Most commercial furnaces and processes require even higher temperatures, which may approach 900 degrees to 950 degrees Fahrenheit. At those temperatures, the thin wall of the club hozzle 9 around the bore 13 is susceptible to distortion. Consequently, prior to the present invention, upon completion of a coating cycle and cooling of the club heads, it was usually necessary to remachine the hozzle bore in order to assemble a shaft 11 to it.

To prevent distortion of the golf club head hozzles 9 during the coating process, the present invention provides a pin 33 for insertion into the hozzle bore 13 of each golf club head 1 prior to placing the heads into the furnace 15. As best shown in FIG. 4, each pin 33 comprises a first end 35 and a second end 37. The first end 35 has a frusto-conical surface. The second end 37 is preferably cylindrical. The frusto-conical surface terminates at a base end in a shoulder 39 that has a diameter greater than the diameter of the cylindrical second end. The pin second end is pressed into a cog 41, as will be described presently. The pin frusto-conical end has a very steep taper, with the included angle being approximately one to two degrees. For coatings and coating procedures that require relatively low temperatures of approximately 650 degrees F., a one degree angle of taper is sufficient. For coatings and processes that require temperatures in the 900 degree F. to 950 degree F. range, a two degree taper gives better results. For clarity, the frusto-conical included angle is shown exaggerated in FIG. 4. The frusto-conical surface is designed such that the pin first end extends into most of the hozzle bore, but the pin does not bottom on the bore blind end 43.

It is preferred that the pin 33 be made of pure carbon, as the coefficient of thermal expansion of that material is negligible within the range of temperatures normally encountered during the physical vapor deposition process. As the golf club head 1 heats up during the physical vapor deposition process, the hozzle bore 13 expands slightly. With a carbon pin, the hozzle will tend to slide down the pin first end 35 toward the shoulder 39. Alternately, the pin may be made of the same material as the substrate 3 of the golf club heads, as for example, the same type stainless steel from which the club heads were cast. By making the pins of the same stainless steel material as the club heads, the expansion and contraction of the pins and club heads are the same under varying temperature conditions. Whether made of carbon or the club head substrate material, the frustoconical surface of the pin, having the very small included angle of approximately one to two degrees, functions to provide support and stability to the hozzle around its bore 13. As a result, the hozzle and bore do not distort, despite the high temperatures at which the physical vapor deposition process occurs. In addition, the pin prevents any coating material from reaching the hozzle bore, FIG. 6. That situation also contributes to the dimensional stability of the hozzle during and after the coating process.

As mentioned, the second end 37 of each pin 33 is pressed into a blind bore 45 in a respective cog 41. The cog bore 45 is concentric with a second blind bore 47. The second bore 47 is placed with a clearance fit over a boss 49 upstanding from the upper face 51 of a ring 53, such that the cog is supported on the ring upper face. The ring 53 is supported on the furnace plate 27. An annular shoulder 55 may be used to locate the ring on the plate 27.

Extending from an interior wall 57 of the furnace 15 is a rod 59. The free end 61 of the rod 59 is located so as to lie partially in the path of the cogs 41 as the plate 27, ring 53, and cogs rotate about the axis 31. For example, looking at FIG. 3, it will be assumed that the plate rotates in the counterclockwise direction of arrow 63. As each cog, such as cog 41A, passes the rod 59, a cog tooth 65A strikes the rod free end 61. The clearance fit between the cog bore 47 and the ring boss 49 enables the rod to index the cog and golf club head 1 clockwise with respect to the ring 53 in the direction of arrow 67. The cog teeth 65 are designed such that adjacent tooth 65B is indexed so as to strike the rod free end 61 the next time the plate 27 brings the cog 41A proximate the rod. The plate and ring rotate together at least as many revolutions about the axis 31 as there are teeth in the cog. In that manner, the cogs and club heads are turned at least through 360 degrees relative to the ring during the physical vapor deposition process, thereby assuring even coating with the titanium nitride material. The ring and the bosses 49 thereon are dimensioned such that each club head is capable of 360 degree rotation without interfering with any other club head.

In summary, the results and advantages of coated golf clubs can now be more fully realized. The gold coating 4 on the club heads 1 provide both a very attractive appearance and a protective layer over the head substrate 3. The club head is coated in a distortion-free manner by the use of a tapered pin 33 inserted into the hozzle bore 13. The pin functions to both maintain the dimensional stability of the hozzle bore during the coating process, and also to prevent any coating material from reaching the hozzle bore. Consequently, there is no need to remachine the hozzle bore after coating is completed.

It will also be recognized that in addition to the superior appearance and performance of the club head 1, the method and apparatus used for its manufacture are such that the club head is but slightly more costly than traditional club heads. Accordingly, the increased benefits of the coated club head outweighs any increase in cost.

Thus, it is apparent that there has been provided, in accordance with the invention, a coated golf club and apparatus and method for the manufacture thereof that fully satisfy the aims and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A golf club head comprising:

a. a head portion formed as a substrate from a ferrous material and having a face for striking a golf ball;

b. a generally tubular hosel having interior and exterior surfaces formed as a substrate from a ferrous material and joined to the head portion; and c. a very thin, hard, tough, and low-friction coating having a thickness of approximately 0.0002 inches to 0.0004 inches deposited on the substrate only on the head portion and on the hosel exterior surface, the coating comprising a microcrystalline, single phase, solid solution structure comprising:

i. about 20 to 70 percent by weight of at least one element from the group consisting of cobalt and nickel;

ii. about 8 to 35 percent by weight of chromium;

iii. about 3 to 20 percent by weight of at least one element from the group consisting of molybdenum and tungsten; and iv. about 0.5 to 10 percent by weight of at least one element from the group consisting of carbon, nitrogen, and boron, wherein about 30 percent to 60 percent by volume of a material selected from the group consisting of nitrides, carbides, and borides of titanium, hafnium, and zirconium is dissolved therein.

2. The golf club head of claim 1 wherein the material dissolved in the coating is titanium nitride, and wherein the titanium nitride material dissolved in the coating has about 7 to 10 percent by weight of molybdenum added thereto to thereby impart a golden appearance to the club head.

\* \* \* \* \*